US011236203B2

(12) United States Patent
Akiba et al.

(10) Patent No.: US 11,236,203 B2
(45) Date of Patent: Feb. 1, 2022

(54) THERMAL CONDUCTIVE SILICONE COMPOSITION, SEMICONDUCTOR DEVICE, AND METHOD FOR MANUFACTURING SEMICONDUCTOR DEVICE

(71) Applicant: SHIN-ETSU CHEMICAL CO., LTD., Tokyo (JP)

(72) Inventors: Shota Akiba, Annaka (JP); Kenichi Tsuji, Annaka (JP); Kunihiro Yamada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 449 days.

(21) Appl. No.: 16/330,574

(22) PCT Filed: Oct. 18, 2017

(86) PCT No.: PCT/JP2017/037633
§ 371 (c)(1),
(2) Date: Mar. 5, 2019

(87) PCT Pub. No.: WO2018/079362
PCT Pub. Date: May 3, 2018

(65) Prior Publication Data
US 2021/0284803 A1    Sep. 16, 2021

(30) Foreign Application Priority Data

Oct. 31, 2016 (JP) .............................. JP2016-213632

(51) Int. Cl.
| | | |
|---|---|---|
| *C08G 77/12* | (2006.01) | |
| *C08G 77/16* | (2006.01) | |
| *C08G 77/08* | (2006.01) | |
| *C08G 77/20* | (2006.01) | |
| *C08K 3/08* | (2006.01) | |
| *C08K 5/14* | (2006.01) | |
| *H01L 23/373* | (2006.01) | |

(52) U.S. Cl.
CPC ............ *C08G 77/16* (2013.01); *C08G 77/08* (2013.01); *C08G 77/12* (2013.01); *C08G 77/20* (2013.01); *C08K 3/08* (2013.01); *C08K 5/14* (2013.01); *H01L 23/373* (2013.01); *C08K 2003/0806* (2013.01); *C08K 2201/001* (2013.01); *C08K 2201/005* (2013.01); *C08K 2201/006* (2013.01); *C08K 2201/011* (2013.01)

(58) Field of Classification Search
CPC ........ C08G 77/12; C08G 77/20; C08G 77/16; B01J 23/40; C08K 5/14; C08K 2201/001
See application file for complete search history.

(56) References Cited

U.S. PATENT DOCUMENTS

| | | | |
|---|---|---|---|
| 5,011,870 A | 4/1991 | Peterson | |
| 5,981,641 A | 11/1999 | Takahashi et al. | |
| 6,136,758 A | 10/2000 | Yamada et al. | |
| 2002/0018885 A1 | 2/2002 | Takahashi et al. | |
| 2004/0192834 A1 | 9/2004 | Nakayoshi | |
| 2007/0131912 A1* | 6/2007 | Simone .................. | H05K 3/321 |
| | | | 252/500 |
| 2008/0057325 A1 | 3/2008 | Sakurai et al. | |
| 2009/0186219 A1 | 7/2009 | Inaba | |
| 2010/0267885 A1 | 10/2010 | Harimoto | |
| 2013/0177658 A1 | 7/2013 | Dowland et al. | |

FOREIGN PATENT DOCUMENTS

| | | |
|---|---|---|
| JP | H02-153995 A | 6/1990 |
| JP | H03-14873 A | 1/1991 |
| JP | H10-110179 A | 4/1998 |
| JP | 2000-063872 A | 2/2000 |
| JP | 2000-063873 A | 2/2000 |
| JP | 3130193 B2 | 1/2001 |
| JP | 2002-030217 A | 1/2002 |
| JP | 3677671 B2 | 8/2005 |
| JP | 2008-056761 A | 3/2008 |
| JP | 2008-222776 A | 9/2008 |
| JP | 2009-108312 A | 5/2009 |

(Continued)

OTHER PUBLICATIONS

Chinese Office Action issued in Patent Application No. 201780062925.0 dated Feb. 3, 2021.
Tong, "Advanced Materials for Thermal Management of Electronic Packaging", Enclosure Industry Press, Published in Apr. 2016, 4 pages.
Office Action dated Mar. 30, 2021, in Indian Patent Application No. 201917011668.
Office Action dated Nov. 3, 2020, in Taiwan Patent Application No. 106137092.
International Search Report for PCT/JP2017/037633 (PCT/ISA/210) dated Jan. 16, 2018.

(Continued)

*Primary Examiner* — Kuo Liang Peng
(74) *Attorney, Agent, or Firm* — Birch, Stewart, Kolasch & Birch, LLP

(57) ABSTRACT

Provided is a thermal conductive silicone composition containing:
(A) an organopolysiloxane having a kinetic viscosity of 10 to 100,000 mm²/s at 25° C., and represented by the following average composition formula (1)

$$R^1_a SiO_{(4-a)/2} \tag{1}$$

wherein $R^1$ represents a hydrogen atom or a monovalent hydrocarbon group, and a represents a number satisfying $1.8 \leq a \leq 2.2$;
(B) silver nanoparticles having an average particle size of 3 to 600 nm;
(C) a thermal conductive filler other than the component (B), having an average particle size of 0.7 to 100 μm and a thermal conductivity of 10 W/m° C. or higher; and
(D) a catalyst selected from the group consisting of a platinum based catalyst, an organic peroxide and a catalyst for condensation reaction.

25 Claims, 1 Drawing Sheet

(56) References Cited

FOREIGN PATENT DOCUMENTS

| | | |
|---|---|---|
| JP | 2013-538924 A | 10/2013 |
| JP | 2014-181316 A | 9/2014 |
| TW | 200817474 A | 4/2008 |
| WO | WO 2014/099639 A1 | 6/2014 |
| WO | WO 2016/116959 A1 | 7/2016 |

OTHER PUBLICATIONS

Written Opinion of the International Searching Authority for PCT/JP2017/037633 (PCT/ISA/237) dated Jan. 16, 2018.
Extended European Search Report dated Jun. 5, 2020, in European Patent Application No. 17864026.4.

* cited by examiner

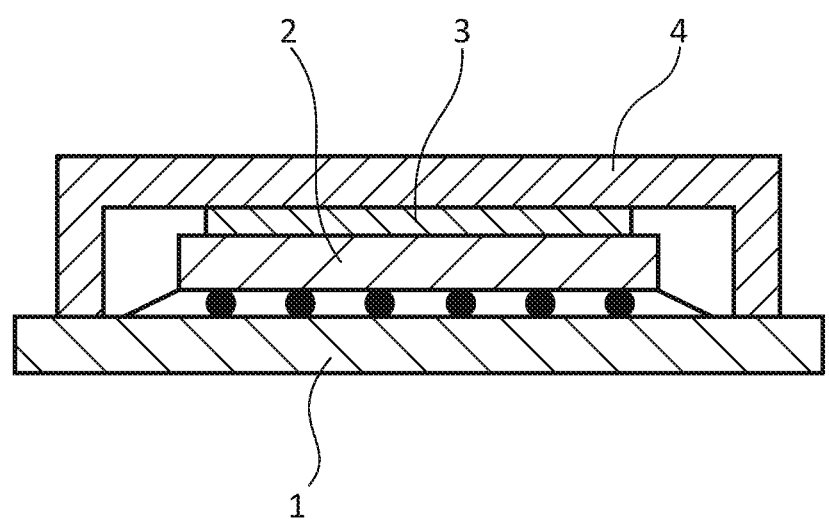

THERMAL CONDUCTIVE SILICONE COMPOSITION, SEMICONDUCTOR DEVICE, AND METHOD FOR MANUFACTURING SEMICONDUCTOR DEVICE

TECHNICAL FIELD

The present invention relates to a silicone composition superior in thermal conductivity; and a semiconductor device using the same.

BACKGROUND ART

Since most electronic parts generate heat during use, such heat has to be eliminated from an electronic part(s) to allow the electronic part to function properly. Especially, since integrated circuit elements such as a CPU used in a personal computer have exhibited a substantial increase in amount of heat generation due to higher operation frequencies, countermeasures against heat are now critical. Thus, there have been proposed various methods for releasing such heat. Particularly, with regard to electronic parts generating large amounts of heat, there has been proposed a method for dissipating the heat by interposing a thermal conductive material such as a thermal conductive grease or a thermal conductive sheet between an electronic part and a member such as a heatsink.

JP-A-Hei 2-153995 (Patent document 1) discloses a silicone grease composition prepared by adding to a particular organopolysiloxane a spherical hexagonal aluminum nitride powder having a particle size within a given range. JP-A-Hei 3-14873 (Patent document 2) discloses a thermal conductive organosiloxane composition prepared by combining an aluminum nitride powder with a finer particle size and an aluminum nitride powder with a larger particle size. JP-A-Hei 10-110179 (Patent document 3) discloses a thermal conductive silicone grease prepared by combining an aluminum nitride powder and a zinc oxide powder. JP-A 2000-63872 (Patent document 4) discloses a thermal conductive grease composition employing an aluminum nitride powder surface-treated with organosilane.

The thermal conductivity of aluminum nitride is 70 to 270 W/mK. Diamond is known as a material having a thermal conductivity higher than that of aluminum nitride, and has a thermal conductivity of 900 to 2,000 W/mK. JP-A 2002-30217 (Patent document 5) discloses a thermal conductive silicone composition using diamond, zinc oxide and a dispersant with a silicone resin.

Further, JP-A 2000-63873 (Patent document 6) and JP-A 2008-222776 (Patent document 7) disclose a thermal conductive grease composition prepared by mixing a base oil such as a silicone oil with a metallic aluminum powder.

Furthermore, a silicone rubber composition employing, as a filler, a silver powder with a high thermal conductivity is disclosed in Japanese Patent No. 3130193 (Patent document 8) and Japanese Patent No. 3677671 (Patent document 9).

Although some of the above thermal conductive materials and thermal conductive greases exhibit a high thermal conductivity, those exhibiting a high thermal conductivity tend to exhibit an insufficient adhesion strength. That is, in such case, peeling will occur between the thermal conductive grease composition and a heat-generating electronic part or heat dissipator, which will then result in an increase in thermal resistance and a lack in reliability accordingly. Therefore, none of the above thermal conductive materials and thermal conductive greases is capable of sufficiently dealing with the recent integrated circuit elements such as a CPU generating a large amount of heat.

PRIOR ART DOCUMENT

Patent Documents

Patent document 1: JP-A-Hei 2-153995
Patent document 2: JP-A-Hei 3-14873
Patent document 3: JP-A-Hei 10-110179
Patent document 4: JP-A 2000-63872
Patent document 5: JP-A 2002-30217
Patent document 6: JP-A 2000-63873
Patent document 7: JP-A 2008-222776
Patent document 8: Japanese Patent No. 3130193
Patent document 9: Japanese Patent No. 3677671

SUMMARY OF THE INVENTION

Problem to be Solved by the Invention

Therefore, it is an object of the present invention to provide a thermal conductive silicone composition having a favorable heat dissipation effect and a high adhesion strength; and a highly reliable semiconductor device having such composition.

Means to Solve the Problem

The inventors of the present invention conducted a series of studies to achieve the above objectives, and completed the invention as follows. That is, the inventors found that not only a heat dissipation effect could be dramatically improved, but an adhesion strength could be improved as well, by mixing into a particular organopolysiloxane a silver nanoparticle(s) having a particular particle size and a particular powder. Specifically, the present invention is to provide the following thermal conductive silicone composition and others.

[1]
A thermal conductive silicone composition comprising:
(A) an organopolysiloxane having a kinetic viscosity of 10 to 100,000 mm²/s at 25° C., and represented by the following average composition formula (1)

$$R^1_a SiO_{(4-a)/2} \tag{1}$$

wherein $R^1$ represents a hydrogen atom or a saturated or unsaturated monovalent hydrocarbon group having 1 to 18 carbon atoms, and a represents a number satisfying $1.8 \leq a \leq 2.2$;
(B) silver nanoparticles having an average particle size of 3 to 600 nm, the silver nanoparticles being in an amount of 50 to 1,700 parts by mass per 100 parts by mass of the component (A);
(C) a thermal conductive filler other than the component (B), having an average particle size of 0.7 to 100 μm and a thermal conductivity of 10 W/m° C. or higher, the thermal conductive filler being in an amount of 50 to 3,000 parts by mass per 100 parts by mass of the component (A); and
(D) a catalyst selected from the group consisting of a platinum based catalyst, an organic peroxide and a catalyst for condensation reaction, the catalyst (D) being in an catalytic amount.

[2]
The thermal conductive silicone composition according to [1], wherein a ratio of a thermal resistance of the composition after heating at 150° C. for 90 min with respect to a thermal resistance of the composition before the heating (thermal resistance after the heating/thermal resistance before the heating) is not higher than 0.5; and a value of (adhesion strength after the heating at 150° C. for 90 min)/(adhesion strength after heating at 60° C. for 90 min) is not smaller than 2.0.

[3]

The thermal conductive silicone composition according to [1] or [2], wherein the thermal conductive filler as the component (C) is a silver powder having an average particle size of 0.7 to 20 μm.

[4]

The thermal conductive silicone composition according to any one of [1] to [3], wherein a mass ratio α/β which is a ratio of a mass α of the silver nanoparticles as the component (B) to a mass β of the thermal conductive filler as the component (C) is 0.03 to 40.

[5]

The thermal conductive silicone composition according to any one of [1] to [4], wherein the thermal conductive filler as the component (C) has a tap density of 3.0 to 7.0 g/cm³ and a specific surface area of 0.08 to 2.0 m²/g.

[6]

The thermal conductive silicone composition according to any one of [1] to [5], wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

[7]

The thermal conductive silicone composition according to any one of [1] to [6], further comprising:

(G) an organosilane being in an amount of 0.1 to 20 parts by mass per 100 parts by mass of the component (A), and represented by the following average composition formula (2)

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$

[8]

A semiconductor device comprising a heat-generating electronic part and a heat dissipator wherein the thermal conductive silicone composition as set forth in any one of [1] to [7] is interposed between the heat-generating electronic part and the heat dissipator.

[9]

A method for manufacturing a semiconductor device, comprising a step of heating the thermal conductive silicone composition as set forth in any one of [1] to [7] to 80° C. or higher with the thermal conductive silicone composition being sandwiched between a heat-generating electronic part and a heat dissipator, and with a pressure of 0.01 MPa or higher being applied thereto.

Effects of the Invention

Since the thermal conductive silicone composition of the present invention has a favorable heat dissipation effect and a high adhesion strength when cured, there can be obtained a highly reliable semiconductor device if using the same.

BRIEF DESCRIPTION OF THE DRAWINGS

FIG. 1 is a vertical cross-sectional schematic diagram showing an example of a semiconductor device of the present invention.

MODE FOR CARRYING OUT THE INVENTION

The thermal conductive silicone composition of the present invention is described in detail hereunder. In the following description, the thermal conductive silicone composition of the invention may simply be referred to as "composition."

Component (A):

An organopolysiloxane as a component (A) is an organopolysiloxane represented by the following average composition formula (1), and having a kinetic viscosity of 10 to 100,000 mm²/s at 25° C.

(In the formula (1), $R^1$ represents one or more groups selected from the group consisting of a hydrogen atom, a hydroxy group, or a saturated or unsaturated monovalent hydrocarbon group having 1 to 18 carbon atoms. a satisfies $1.8 \leq a \leq 2.2$.)

In the formula (1), examples of the saturated or unsaturated monovalent hydrocarbon group having 1 to 18 carbon atoms, as represented by $R^1$, include alkyl groups such as a methyl group, an ethyl group, a propyl group, a hexyl group, an octyl group, a decyl group, a dodecyl group, a tetradecyl group, a hexadecyl group and an octadecyl group; cycloalkyl groups such as a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; and halogenated hydrocarbon groups such as 3,3,3-trifluoropropyl group, 2-(perfluorobutyl)ethyl group, 2-(perfluorooctyl)ethyl group and p-chlorophenyl group. When the silicone composition of the invention is used as a grease, a is preferably 1.8 to 2.2, particularly preferably 1.9 to 2.1, in terms of consistency required for a silicone grease composition.

Further, as for the kinetic viscosity of the organopolysiloxane used in the present invention at 25° C., a composition containing the organopolysiloxane will exhibit oil bleed easily when such kinetic viscosity is lower than 10 mm²/s; and workability of the composition will be impaired due to an increase in viscosity when such kinetic viscosity is higher than 100,000 mm²/s. Thus, it is required that the kinetic viscosity of the organopolysiloxane as the component (A) at 25° C. be 10 to 100,000 mm²/s, particularly preferably 30 to 10,000 mm²/s. Here, the kinetic viscosity of the organopolysiloxane refers to a value measured by an Ostwald viscometer at 25° C.

Components (E) and (F):

It is preferred that a part of or the whole component (A) be a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

The component (E) which is the organopolysiloxane containing silicon atom-bonded alkenyl groups, contains in one molecule at least 2 (normally 2 to 50), preferably about 2 to 20, more preferably about 2 to 10 silicon atom-bonded alkenyl groups. Examples of the alkenyl groups in the organopolysiloxane as the component (E) include a vinyl group, an allyl group, a butenyl group, a pentenyl group, a hexenyl group and a heptenyl group, among which a vinyl group is particularly preferred. The alkenyl groups in the component (E) may be bonded to silicon atoms present at molecular chain terminals and/or silicon atoms present at moieties on the molecular chain other than the terminals.

In the organopolysiloxane as the component (E), as organic groups other than the alkenyl groups that are capable of being bonded to silicon atoms, there can be listed alkyl groups such as a methyl group, an ethyl group, a propyl group, a butyl group, a pentyl group, a hexyl group and a heptyl group; aryl groups such as a phenyl group, a tolyl group, a xylyl group and a naphthyl group; aralkyl groups such as a benzyl group and a phenethyl group; and halogenated alkyl groups such as a chloromethyl group, 3-chloropropyl group and 3,3,3-trifluoropropyl group, among which a methyl group and a phenyl group are particularly preferred.

The molecule structure of such component (E) may, for example, be a linear structure, a partially branched linear structure, a cyclic structure, a branched structure and a three-dimensional network structure. Basically, preferred are a linear diorganopolysiloxane having a main chain composed of repeating diorganosiloxane units (D units), and having both of its molecular chain terminals blocked by triorganosiloxy groups; and a mixture of a linear diorganopolysiloxane and a branched or three-dimensional network organopolysiloxane.

The organohydrogenpolysiloxane as the component (F) has in one molecule at least 2 (normally 2 to 300), preferably about 2 to 100 silicon atom-bonded hydrogen atoms (i.e. SiH groups), and may be any one of a linear, branched, cyclic or three-dimensional network resinous substance. The hydrogen atoms in the component (F) may be bonded to silicon atoms present at molecular chain terminals and/or silicon atoms present at moieties on the molecular chain other than the terminals.

In the organohydrogenpolysiloxane as the component (F), organic groups other than the hydrogen atoms may be bonded to silicon atoms as well. Examples of such organic groups include alkyl groups such as a methyl group, an ethyl group, a propyl group, a butyl group, a pentyl group, a hexyl group and a heptyl group; aryl groups such as a phenyl group, a tolyl group, a xylyl group and a naphthyl group; aralkyl groups such as a benzyl group and a phenethyl group; and halogenated alkyl groups such as a chloromethyl group, 3-chloropropyl group and 3,3,3-trifluoropropyl group, among which a methyl group and a phenyl group are preferred.

Further, together with the organopolysiloxane as the component (A) that is represented by the average composition formula (1), there may also be added a hydrolyzable group-containing organopolysiloxane (component (H)) represented by the following general formula (3). This hydrolyzable organopolysiloxane is preferably contained in an amount of 0.1 to 20% by mass, more preferably 0.1 to 10% by mass, with respect to the component (A).

[Chemical formula 1]

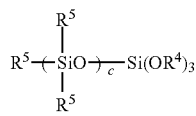

(3)

In the formula (3), $R^4$ represents an alkyl group having 1 to 6 carbon atoms; each $R^5$ independently represents a saturated or unsaturated monovalent hydrocarbon group that has 1 to 18 carbon atoms and may have a substituent group(s); c represents a number of 5 to 120. The organopolysiloxane represented by the formula (3) assists in highly filling a silicone composition with a powder. Further, the surface of a powder can also be hydrophobized by such organopolysiloxane.

In the formula (3), $R^4$ represents an alkyl group having 1 to 6 carbon atoms. For example, there can be listed alkyl groups each having 1 to 6 carbon atoms, such as a methyl group, an ethyl group and a propyl group, among which a methyl group and an ethyl group are particularly preferred. Each $R^5$ independently represents a saturated or unsaturated, substituted or unsubstituted monovalent hydrocarbon group that has 1 to 18, preferably 1 to 10 carbon atoms, and may have a substituent group(s). Examples of such monovalent hydrocarbon group include alkyl groups such as a methyl group, an ethyl group, a propyl group, a hexyl group, an octyl group, a decyl group, a dodecyl group, a tetradecyl group, a hexadecyl group and an octadecyl group; cycloalkyl groups such as a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; or groups obtained by substituting a part of or all the hydrogen atoms in any of these groups with, for example, cyano groups and halogen atoms such as fluorine, bromine and chlorine atoms, the examples of such substituted groups including 3,3,3-trifluoropropyl group, 2-(perfluorobutyl)ethyl group, 2-(perfluorooctyl)ethyl group and p-chlorophenyl group. Among the above examples, a methyl group is particularly preferred. In the formula (3), c represents a number of 5 to 120, preferably a number of 10 to 90.

Component (B):

A component (B) is a silver nanoparticle(s) having an average particle size of 3 to 600 nm. When the average particle size of the silver nanoparticles as the component (B) is smaller than 3 nm, workability will be impaired due to an increase in viscosity of the composition obtained. Further, an average particle size larger than 600 nm makes it difficult for the silver nanoparticles to form thermal conductive paths, which will then impair thermal conductivity. Thus, the average particle size of the silver nanoparticles as the component (B) is 3 to 600 nm, preferably 50 to 400 nm, more preferably 100 to 350 μm. Particularly, in the present invention, the average particle size of the silver nanoparticles is an average value obtained by measuring the projected diameters of 600 particles in a fixed direction at 5,000-fold magnification using a scanning electron microscope (SEM).

The silver nanoparticles as the component (B) used in the present invention can be produced by mixing a silver salt of carboxylate and an aliphatic primary amine, and then adding a reductant thereto so as to deposit the silver nanoparticles at a reaction temperature of 20 to 80° C. Further, a known silver powder may be used as the silver nanoparticles as the component (B).

The composition will exhibit an impaired thermal conductivity when the silver nanoparticles as the component (B) are added in an amount of smaller than 50 parts by mass per 100 parts by mass of the component (A). When the silver nanoparticles as the component (B) are added in an amount of larger than 1,700 parts by mass, the composition obtained will exhibit an increased viscosity, which will then lead to an impaired workability. Thus, the silver nanoparticles as the component (B) are added in an amount of 50 to 1,700 parts by mass, preferably 250 to 1,100 parts by mass, more preferably 400 to 800 parts by mass.

Component (C):

A component (C) is a thermal conductive filler other than the component (B), the component (C) having an average particle size of 0.7 to 100 μm and a thermal conductivity of not lower than 10 W/m° C. The composition obtained will exhibit a lower thermal conductivity, when the average particle size of the thermal conductive filler as the component (C) is smaller than 0.7 μm; and the composition obtained will exhibit a higher thermal resistance when the average particle size of the thermal conductive filler as the component (C) is larger than 100 μm. In each case, the performance of the composition will be impaired. Therefore, the average particle size of the component (C) is 0.7 to 100 μm, preferably 1 to 50 μm, more preferably 1.5 to 30 μm. Here, in the present invention, the average particle size of the thermal conductive filler is a volume average diameter [MV] on volumetric basis that can be measured by Microtrac MT3300EX (laser diffraction/scattering particle size distribution measuring device) manufactured by Nikkiso Co., Ltd.

The thermal conductivity of the component (C) is not lower than 10 W/m° C., favorably 10 to 2,000 W/m° C., preferably 100 to 2,000 W/m° C., more preferably 200 to 2,000 W/m° C. When the thermal conductivity of the component (C) is lower than 10 W/m° C., the composition will exhibit a lower thermal conductivity. Here, in the present invention, the thermal conductivity of the thermal conductive filler is a value measured by QTM-500 (quick thermal conductivity meter) manufactured by Kyoto Electronics Manufacturing Co., Ltd.

The thermal conductive filler as the component (C) is added in an amount of 50 to 3,000 parts by mass, preferably 100 to 1,700 parts by mass, more preferably 200 to 1,200 parts by mass, per 100 parts by mass of the component (A). The composition obtained will exhibit a lower thermal conductivity when the thermal conductive filler as the component (C) is added in an amount of smaller than 50 parts by mass per 100 parts by mass of the component (A); and the composition obtained will exhibit an impaired workability due to an increased viscosity, when the thermal conductive filler as the component (C) is added in an amount of larger than 3,000 parts by mass per 100 parts by mass of the component (A).

Examples of the thermal conductive filler as the component (C) include powders of silver, aluminum, zinc oxide, titanium oxide, magnesium oxide, alumina, aluminum hydroxide, boron nitride, aluminum nitride, diamond, gold, copper, carbon, nickel, indium, gallium and metallic silicon, among which a silver powder is preferred.

If a silver powder is used as the thermal conductive filler as the component (C), it is preferred that the average particle size of such silver powder be 0.7 to 20 μm. The composition obtained will exhibit a lower thermal conductivity when the average particle size of the silver powder is smaller than 0.7 μm; and the composition obtained will exhibit a higher thermal resistance when the average particle size of the silver powder is larger than 20 μm. In each case, the performance of the composition will be impaired. Therefore, the average particle size of the silver powder is 0.7 to 20 μm, preferably 1 to 15 μm, more preferably 1.5 to 10 μm. Further, a known silver powder may be used as the silver powder as the component (C). There are no particular restrictions on the shape of the silver powder. For example, there may be employed a spherical, granular or flaky (scalelike) silver powder.

As for a mass ratio α/β where a represents the mass of the silver nanoparticles as the component (B) and β represents the mass of a thermal conductive filler when the component (C) is a thermal conductive filler, the composition obtained will exhibit a lower thermal conductivity when the mass ratio α/β is smaller than 0.03; and the composition obtained will exhibit an impaired workability due to an increased viscosity when such mass ratio α/β is larger than 40. Thus, the mass ratio α/β is preferably 0.03 to 40, more preferably 0.1 to 10, and even more preferably 0.3 to 3.

It is preferred that the thermal conductive filler as the component (C) have a tap density of 3.0 to 7.0 g/cm$^3$, and a specific surface area of 0.08 to 2.0 m$^2$/g. When the tap density of the thermal conductive filler as the component (C) is lower than 3.0 g/cm$^3$, a filling rate of the component (C) in the composition will not increase such that the viscosity of the composition will increase, and that workability may be impaired accordingly. Therefore, the tap density of the thermal conductive filler as the component (C) is 3.0 to 7.0 g/cm$^3$, preferably 4.0 to 7.0 g/cm$^3$, more preferably 4.5 to 7.0 g/cm$^3$. Here, the tap density of the silver powder used as the thermal conductive filler in this specification is a value obtained as follows. That is, 100 g of a silver powder is weighed out at first, and then gently dropped into a 100 ml graduated cylinder. The graduated cylinder is then placed on a tap density measuring device to drop the silver powder 600 times at a dropping distance of 20 mm and a rate of 60 times/min. Later, the volume of the compacted silver powder is measured.

Further, when the specific surface area of the thermal conductive filler as the component (C) is larger than 2.0 m$^2$/g, the filling rate of the thermal conductive filler in the composition cannot be raised such that the viscosity of the composition will increase, and that workability will be impaired accordingly. Thus, the specific surface area of the silver powder as the component (C) is 0.08 to 2.0 m$^2$/g, preferably 0.08 to 1.5 m$^2$/g, more preferably 0.08 to 1.0 m$^2$/g. The specific surface area of the silver powder as the thermal conductive filler as the component (C), was calculated by BET method. At first, about 2 g of a silver powder is taken as a sample, and then degassed at 60±5° C. for 10 min, followed by using an automatic specific surface area measuring device to measure a total surface area thereof. Later, the sample amount is measured, and the specific surface area is then calculated based on the following formula (4).

Specific surface area(m$^2$/g)=Total surface area (m$^2$)/Sample amount(g)     (4)

Further, if necessary, the thermal conductive filler as the component (C) may also be hydrophobized with, for example, organosilane, organosilazane, organopolysiloxane and an organic fluorine compound. A hydrophobization method may be a generally known method. For example, there may be employed a method of mixing an aluminum powder and organosilane or a partial hydrolysate thereof, using a mixer such as Trimix™, Twin Mix™, Planetary Mixer™, Ultramixer™ and Hivis Disper Mix™. There, if necessary, heating may be performed to 50 to 100° C. Particularly, when performing mixing, there may also be used a solvent such as toluene, xylene, petroleum ether, mineral spirits, isoparaffin, isopropylalcohol and ethanol. In such case, it is preferred that the solvent be eliminated by, for example, a vacuum device after mixing. Further, as a diluting solvent, there may also be used an organopolysiloxane as the component (A) which is a liquid component in the present invention. In such case, organosilane or its partial hydrolysate as a treating agent may be mixed with organopolysiloxane in advance, followed by adding thereto the thermal conductive filler as the component (C) so as to enable treatment and mixing at the same time. A composition produced by this method is also within the scope of the present invention.

Further, in addition to the components (A), (B), (C) and the later-described component (D), the thermal conductive silicone composition of the present invention may also contain an inorganic compound powder and/or an organic compound material without impairing the effects of the invention. As such inorganic compound powder, those with high thermal conductivities are preferred. The inorganic compound powder may be at least one selected from an aluminum powder, a zinc oxide powder, a titanium oxide powder, a magnesium oxide powder, an alumina powder, an aluminum hydroxide powder, a boron nitride powder, an aluminum nitride powder, a diamond powder, a gold powder, a copper powder, a carbon powder, a nickel powder, an indium powder, a gallium powder, a metallic silicon powder and a silicon dioxide powder. As the organic compound material, those with high conductivities are preferred as well. Such organic compound material may be at least one selected from carbon fiber, graphene, graphite, carbon nanotube and a carbon material.

If necessary, the surfaces of these inorganic compound powder and organic compound material may be hydrophobized with, for example, organosilane, organosilazane, organopolysiloxane and an organic fluorine compound. The average particle size of the inorganic compound powder and the organic compound material is preferably 0.5 to 100 µm, particularly preferably 1 to 50 µm, so that the filling rate thereof in the composition can be raised. Further, the filling rate of a carbon fiber in the composition will not increase when the fiber length of such carbon fiber is smaller than 10 µm or larger than 500 µm. Thus, the average particle size of the inorganic compound powder and organic compound material is preferably 10 to 500 particularly preferably 30 to 300 µm, the inorganic compound powder and organic compound material being the components other than the components (A), (B), (C) and (D). When a total amount of the inorganic compound powder and organic compound material added is larger than 3,000 parts by mass per 100 parts by mas of the component (A), workability will be impaired due to a poor fluidity. Therefore, the total amount of the inorganic compound powder and organic compound material added is preferably 0.1 to 3,000 parts by mass, particularly preferably 0.1 to 2,000 parts by mass, per 100 parts by mass of the component (A).

Component (D):

A component (D) is a catalyst selected from the group consisting of a platinum-based catalyst, an organic peroxide and a catalyst for condensation reaction. The composition of the present invention can be turned into a curable composition by adding such catalyst as the component (D).

If the composition of the invention is to be cured by hydrosilylation reaction, a platinum-based catalyst as the component (D) is added to the components (E) and (F) as the component (A). The amount of the component (F) added is preferably an amount such that the silicon atom-bonded hydrogen atoms in the component (F) will be present in an amount of 0.1 to 15.0 mol, more preferably 0.1 to 10.0 mol, particularly preferably 0.1 to 5.0 mol, per 1 mol of the alkenyl groups in the component (E). Examples of a platinum-based catalyst include a platinum-divinyltetramethyldisiloxane complex, chloroplatinic acid, an alcohol solution of chloroplatinic acid, an olefin complex of platinum, an alkenylsiloxane complex of platinum and a carbonyl complex of platinum. In the composition of the present invention, the platinum-based catalyst is contained in an amount required for curing the composition of the invention i.e. the so-called catalytic amount. Specifically, the amount of the platinum-based catalyst is preferably such that the concentration of the platinum metal in the component (D) will be 0.1 to 2,000 ppm in mass unit, particularly preferably 0.1 to 1,500 ppm in mass unit, per the amount of the component (A) added.

Moreover, in order to control the curing speed of the composition of the invention and improve its treating workability, a curing reaction inhibitor may be contained in the composition. Examples of such curing reaction inhibitor include acetylene-based compounds such as 2-methyl-3-butyne-2-ol, 2-phenyl-3-butyne-2-ol and 1-ethynyl-1-cyclohexanol; ene-yne compounds such as 3-methyl-3-pentene-1-yne and 3,5-dimethyl-3-hexene-1-yne; hydrazine-based compounds; phosphine-based compounds; and mercaptan-based compounds. Although there are no particular restrictions on the amount of such curing reaction inhibitor contained, it is preferred that the curing reaction inhibitor be contained in an amount of 0.0001 to 1.0 parts by mass per 100 parts by mass of the component (A).

Meanwhile, if the composition of the present invention is to be cured by free radical reaction caused by an organic peroxide, an organic peroxide is preferred as a curing catalyst. Examples of such organic peroxide include benzoyl peroxide, di(p-methylbenzoyl)peroxide, di(o-methylbenzoyl)peroxide, dicumylperoxide, 2,5-dimethyl-2,5-bis(t-butylperoxy)hexane, di-t-butylperoxide, t-butylperoxide benzoate and 1,1-di(t-butylperoxy)cyclohexane. This organic peroxide is contained in an amount required for curing the composition of the invention i.e. the so-called catalytic amount. Specifically, the organic peroxide is contained in an amount of 0.1 to 8 parts by mass per 100 parts by mass of the component (A).

Further, if the composition of the present invention is to be cured by condensation reaction, it is preferred that the composition contain, as a curing agent, a silane or siloxane oligomer having in one molecule at least three silicon atom-bonded hydrolyzable groups; and as a curing catalyst, a catalyst for condensation reaction. Here, examples of the silicon atom-bonded hydrolyzable group include an alkoxy group, an alkoxyalkoxy group, an acyloxy group, a ketoxime group, an alkenoxy group, an amino group, an aminoxy group and an amide group. Further, other than the above hydrolyzable groups, organic groups may also be bonded to the silicon atoms in such silane. As such organic groups that may be bonded to the silicon atoms, there can be listed a linear alkyl group, a branched alkyl group, a cyclic alkyl group, an alkenyl group, an aryl group, an aralkyl group and an halogenated alkyl group, as mentioned above. Examples of the silane or siloxane oligomer include tetraethoxysilane, methyltriethoxysilane, vinyltriethoxysilane, methyltris(methylethylketoxime)silane, vinyltriacetoxysilane, ethylorthosilicate and vinyltri(isopropenoxy)silane. This silane or siloxane oligomer is contained in an amount required for curing the composition of the invention i.e. the so-called catalytic amount. Specifically, the silane or siloxane oligomer is preferably contained in an amount of 0.01 to 20 parts by mass, more preferably 0.1 to 10 parts by mass, per 100 parts by mass of the component (A).

Further, the catalyst for condensation reaction is an optional component which is not essential if using, as a curing agent, a silane having a hydrolyzable group(s) such as an aminoxy group, an amino group and a ketoxime group. Examples of such catalyst for condensation reaction include organic titanate esters such as tetrabutyl titanate and tetraisopropyl titanate; organic titanium chelate compounds such as diisopropoxybis(acetylacetate)titanium and diisopropoxybis(ethylacetoacetate)titanium; organic aluminum compounds such as aluminum tris(acetylacetonate) and aluminum tris(ethylacetoacetate); organic zirconium compounds such as zirconium tetra(acetylacetonate) and zirconium tetrabutylate; organic tin compounds such as dibutyltin dioctoate, dibutyltin dilaurate and butyltin-2-ethylhexoate; metallic salts of organic carboxylic acids, such as tin naphthenate, tin oleate, tin butylate, cobalt naphthenate and zinc stearate; amine compounds such as hexylamine and dodecylamine phosphate, and salts thereof; quaternary ammonium salts such as benzyltriethylammonium acetate; lower fatty acid salts of alkali metals, such as potassium acetate; dialkylhydroxylamines such as dimethylhydroxylamine and diethylhydroxylamine; guanidyl group-containing organic silicon compounds; and tetramethylguanidylpropyltrimethoxysilane.

In the composition of the present invention, the catalyst for condensation reaction is contained in an arbitrary amount. Specifically, if added, the catalyst for condensation reaction is preferably added in an amount of 0.01 to 20 parts by mass, particularly preferably 0.1 to 10 parts by mass, per 100 parts by mass of the component (A).

Component (G):

Further, as a component (G), an organosilane represented by the following general formula (2) may be added to the composition of the present invention.

$$R^2_b Si(OR^3)_{4-b} \quad (2)$$

In the formula (2), $R^2$ represents at least one group selected from: a saturated or unsaturated monovalent hydrocarbon group that may have a substituent group(s) and has 1 to 18, preferably 1 to 6 carbon atoms; an epoxy group; an acryl group; and a methacryl group. $R^3$ represents a monovalent hydrocarbon group having 1 to 18, preferably 1 to 6 carbon atoms. b satisfies 1≤b≤3.

Specific examples of $R^2$ in the general formula (2) include alkyl groups such as a methyl group, an ethyl group, a propyl group, a hexyl group, an octyl group, a nonyl group, a decyl group, a dodecyl group and a tetradecyl group; cycloalkyl groups such as a cycloalkylalkenyl group, an acryl group, an epoxy group, a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; and halogenated hydrocarbon groups such as 3,3,3-trifluoropropyl group, 2-(perfluorobutyl)ethyl group, 2-(perfluorooctyl)ethyl group and p-chlorophenyl group. Examples of the substituent group(s) in the monovalent hydrocarbon group include an acryloyloxy group and a methacryloyloxy group. Further, b represents a number of 1 to 3. $R^3$ represents at least one alkyl group having 1 to 6 carbon atoms, such as a methyl group, an ethyl group, a propyl group, a butyl group, a pentyl group and a hexyl group, among which a methyl group and an ethyl group are particularly preferred.

Specific examples of the organosilane as the component (G) that is represented by the general formula (2), include the following compounds.

$C_{10}H_{12}Si(OCH_3)_3$ $C_{12}H_{25}Si(OCH_3)_3$ $C_{12}H_{25}Si(OC_2H_5)_3$ $C_{10}H_{21}Si(CH_3)(OCH_3)_2$ $C_{10}H_{21}Si(C_6H_6)(OCH_3)_2$ $C_{10}H_{21}Si(CH_3)(OC_2H_5)_2$ $C_{10}H_{21}Si(CH=CH_2)(OCH_3)_2$ $C_{10}H_{21}Si(CH_2CH_2CF_3)(OCH_3)_2$ $CH_2=C(CH_3)COOC_8H_{16}Si(OCH_3)_3$

If the organosilane as the component (G) is used in the composition of the invention, it is preferably added in an amount of 0.1 to 20 parts by mass, more preferably 0.1 to 10 parts by mass, per 100 parts by mass of the component (A).

The silicone composition of the present invention may be produced in accordance with a conventionally known method for producing a silicone grease composition, and there are no particular restrictions on such method. For example, the silicone composition of the invention can be produced by mixing the above components (A) to (D) together with other components if necessary for 30 min to 4 hours, using a mixer such as Trimix™, Twin Mix™, Planetary Mixer™, Ultramixer™ and Hivis Disper Mix™. Further, mixing may be performed while performing heating at 50 to 200° C. as necessary.

The absolute viscosity of the thermal conductive silicone composition of the invention measured at 25° C. is 10 to 600 Pa·s, preferably 15 to 500 Pa·s, more preferably 15 to 400 Pa·s. When the absolute viscosity is within the above ranges, a favorable thermal conductive silicone composition can be provided. Further, the thermal conductive silicone composition of the invention is superior in workability. The above absolute viscosity can be achieved by regulating the amount of each component to the abovementioned amount(s). The absolute viscosity is a result measured by PC-1TL (10 rpm) manufactured by Malcom Co., Ltd.

Method for Curing the Thermal Conductive Silicone Composition of the Invention:

The thermal conductive silicone composition of the present invention can be used after being cured. The thermal conductive silicone composition of the invention can be cured when heated. A heating temperature is preferably not lower than 80° C., more preferably 90 to 300° C., even more preferably 100 to 300° C., and particularly preferably 120 to 300° C. When the heating temperature is not lower than 80° C., the silver nanoparticles and silver powder can efficiently form thermal conductive paths such that the thermal conductivity of the thermal conductive silicone composition of the invention can be improved. Further, when the heating temperature is not higher than 300° C., the thermal conductive silicone composition will be allowed to possess an appropriate hardness.

A heating time is preferably not shorter than 1 min, more preferably 10 to 300 min, even more preferably 30 to 300 min, and particularly preferably 60 to 300 min. When the heating time is not shorter than 1 min, the silver nanoparticles and silver powder will form thermal conductive paths such that thermal conductivity can be improved. Further, when the heating time is 300 min or shorter the thermal conductive silicone composition will be allowed to possess an appropriate hardness. Moreover, a pressure may be applied at the time of performing heating. The pressure is preferably not lower than 0.01 MPa, more preferably 0.05 to 100 MPa, and even more preferably 0.1 to 100 MPa.

As for the thermal resistance of the thermal conductive silicone composition of the invention, a ratio of a thermal resistance observed after performing heat curing at 150° C. for 90 min to a thermal resistance observed before performing such heat curing (thermal resistance after heat curing/thermal resistance before heat curing) is not higher than 0.5, preferably not higher than 0.3. The smaller this ratio is, the more preferable it becomes. However, a factual lower limit thereof is 0.01. The thermal resistance of the thermal conductive silicone composition of the invention, after being heated at 150° C. for 90 min, is preferably not higher than 5.0 mm$^2$·K/W, more preferably not higher than 3.5 mm$^2$·K/W, even more preferably not higher than 2.5 mm$^2$·K/W, and particularly preferably not higher than 2.0 mm$^2$·K/W. Further, the thermal resistance of the unheated thermal conductive silicone composition of the invention at 25° C. is preferably not higher than 50 mm$^2$·K/W, more preferably not higher than 25 mm$^2$·K/W, even more preferably not higher than 20 mm$^2$·K/W, and particularly preferably not higher than 15 mm$^2$·K/W. A method for measuring the thermal resistance is as follows. Specifically, the composition is to be at first sandwiched between two φ 12.7 mm aluminum plates, followed by leaving them at room temperature for 15 min with a pressure of 0.14 MPa being applied thereto. Thus, a test piece is obtained, and the thermal resistance of the unheated composition is then measured. Later, with a pressure of 0.35 MPa being applied to the test piece, the test piece is to be placed in an oven of 150° C. for 90 min so as to heat and cure the composition making up the test piece. The thermal resistance of the heated composition is then measured.

As for an adhesion strength of the thermal conductive silicone composition of the invention that is measured after attaching the composition to a silicon wafer, a ratio between an adhesion strength observed after performing heat curing at 150° C. for 90 min and an adhesion strength observed after performing heat curing at 60° C. for 90 min is not lower than 2.0, preferably not lower than 4.0. An adhesion strength of the composition of the invention that has been heated at a temperature of not lower than 80° C. is preferably not lower than 5.0 kgf/cm$^2$, more preferably not lower than 8.0 kgf/cm$^2$, even more preferably not lower than 10.0 kgf/cm$^2$, and particularly preferably not lower than 15.0 kgf/cm$^2$. An adhesion strength of the composition of the invention that has been heated at a temperature of lower than 80° C. is preferably not lower than 0.5 kgf/cm$^2$, more preferably not lower than 1.0 kgf/cm$^2$, even more preferably not lower than 2.0 kgf/cm$^2$, and particularly preferably not lower than 2.5 kgf/cm$^2$.

The adhesion strength of the composition of the invention is measured by the following method. The composition is to be sandwiched between a 1 mm×1 mm silicon wafer and a 2.5 mm×2.5 mm silicon wafer, followed by heating them at 60° C. for 90 min with a pressure of 1.8 kgf being applied thereto via a clip. The adhesion strength of the composition is then measured. The composition is also to be sandwiched between the 1 mm×1 mm silicon wafer and the 2.5 mm×2.5 mm silicon wafer, followed by heating them at 150° C. for 90 min with the pressure of 1.8 kgf being applied thereto via the clip. The adhesion strength of the composition is then measured as well.

Semiconductor Device:

One of the features of the semiconductor device of the present invention is that the thermal conductive silicone composition of the invention is interposed between the surface of a heat-generating electronic part and a heat dissipator. It is preferred that the thermal conductive silicone composition of the invention interposed have a thickness of 10 to 200 μm. Although a structural example of the semiconductor device of the invention is shown in FIG. 1, the semiconductor device is not limited to that shown in FIG. 1. In FIG. 1, 1 represents a substrate; 2 represents a heat-generating electronic part (CPU); 3 represents a thermal conductive silicone composition layer; 4 represents a heat dissipator (lid).

It is preferred that the semiconductor device of the present invention be produced by heating the thermal conductive silicone composition of the invention interposed between the heat-generating electronic part and the heat dissipator to 80° C. or higher with a pressure of not lower than 0.01 MPa being applied thereto. At that time, the pressure applied to the structural body having the laminated structure prepared by stacking the heat-generating electronic part, thermal conductive silicone composition and heat dissipator is preferably not lower than 0.01 MPa, more preferably 0.05 to 100 MPa, and even more preferably 0.1 MPa to 100 MPa. The temperature for heating needs to be 80° C. or higher, preferably 90 to 300° C., more preferably 100 to 300° C., and even more preferably 120 to 300° C. There are no limitations on the property of a cured product of the thermal conductive silicone composition that is obtained by the method listed above. The cured product may, for example, be in the form of a gel, a low hardness rubber or a high hardness rubber. The hardness of the rubber-like cured product of the thermal conductive silicone composition of the invention can be measured by an ASKER durometer type C. As for the hardness of the rubber-like cured product that is measured by the ASKER durometer type C, a measured value of about 80 is regarded as a rough standard, where, for example, the cured product may be considered as a low hardness rubber-like cured product when its hardness is lower than 80, and as a high hardness rubber-like cured product when its hardness is 80 or higher.

WORKING EXAMPLE

The present invention is described in greater detail hereunder with reference to working and comparative examples to further clarify the effects of the invention. However, the invention is not limited to these examples.

Tests regarding the effects of the invention were performed as follows.

Viscosity

The absolute viscosities of the compositions in the working and comparative examples were measured by a Malcom viscometer (Type PC-1TL) at 25° C.

Thermal Resistance Measurement

A laminated body having a laminated structure of first aluminum plate/composition/second aluminum plate in which a composition prepared in a working or comparative example was sandwiched between two φ 12.7 mm aluminum plates, was left under room temperature for 15 min with a pressure of 0.14 MPa being applied thereto, thereby obtaining a test piece. The thermal resistance of the unheated composition in each test piece was then measured. Later, each test piece was placed in an oven of 150° C. for 90 min with a pressure of 0.35 MPa being applied thereto so as to heat and cure the composition. The thermal resistance of the composition in each test piece heated was then measured as well. Here, the thermal resistance measurement was carried out by NanoFlash (LFA 447 by NETZSCH).

Minimum Thickness (BLT) Measurement when Compressed

A thickness of two φ 12.7 mm aluminum plates each having a thickness of 1 mm was measured, followed by producing a laminated body having a laminated structure similar to that of the laminated body described above for use in thermal resistance measurement. This laminated body was then left under room temperature for 15 min with a pressure of 0.14 MPa being applied thereto, thereby obtaining a test piece for BLT measurement. The thickness of each unheated test piece was measured. Later, each test piece was placed in an oven of 150° C. for 90 min with a pressure of 0.35 MPa being applied thereto so as to heat and cure the composition. The thickness of each test piece heated was then measured as well. BLT was calculated based on the following formula (5).

$$BLT(\mu m) = \text{Thickness of test piece}(\mu m) - \text{Thickness of two aluminum plates used}(\mu m) \quad (5)$$

Here, thickness measurement was performed by a Digimatic standard Outside Micrometer (MDC-25MX by Mitutoyo Corporation).

Adhesion Strength

A laminated body having a laminated structure of first silicon wafer/composition/second silicon wafer in which a composition prepared in a working or comparative example was sandwiched between a 1 mm×1 mm silicon wafer and a 2.5 mm×2.5 mm silicon wafer, was heated at 60° C. for 90 min with a pressure of 1.8 kgf being applied thereto via a clip. The adhesion strength of the composition was then measured. A laminated body having a similar laminated structure as above was further heated at 150° C. for 90 min with a pressure of 1.8 kgf being applied thereto via a clip. The adhesion strength of the composition was then measured as well. Here, adhesion strength measurement was performed using Dage series-4000PXY by Dage Deutchland GmbH.

Components of each composition prepared in the working and comparative examples are as follows.

Component (A)

A-1: Dimethylpolysiloxane with both ends blocked by dimethylvinylsilyl groups, and having a kinetic viscosity of 600 mm$^2$/s at 25° C.

A-2: Organohydrogenpolysiloxane represented by the following formula (6), and having a kinetic viscosity of 30 mm$^2$/s at 25° C.

[Chemical formula 2]

$$H_3C-\underset{\underset{CH_3}{|}}{\overset{\overset{CH_3}{|}}{Si}}O-(\underset{\underset{CH_3}{|}}{\overset{\overset{H}{|}}{Si}}O)_{16}-(\underset{\underset{CH_3}{|}}{\overset{\overset{CH_3}{|}}{Si}}O)_{28}-\underset{\underset{CH_3}{|}}{\overset{\overset{CH_3}{|}}{Si}}-CH_3 \quad (6)$$

A-3: Dimethylpolysiloxane with both ends blocked by hydroxyl groups, and having a kinetic viscosity of 5,000 mm$^2$/s at 25° C.

Component (B)

B-1: Silver nanoparticles having an average particle diameter of 350 nm

B-2: Silver nanoparticles having an average particle diameter of 100 nm

B-3: Silver nanoparticles having an average particle diameter of 600 nm

B-4 (Comparative example): Silver nanoparticles having an average particle diameter of 0.5 nm B-5 (Comparative example): Silver nanoparticles having an average particle diameter of 650 nm Component (C)

C-1: Flaky silver powder having an average particle size of 2.5 μm, a thermal conductivity of 420 W/m° C., a tap density of 5.0 g/cm$^3$ and a specific surface area of 0.80 m$^2$/g C-2: Flaky silver powder having an average particle size of 3.5 μm, a thermal conductivity of 420 W/m° C., a tap density of 6.2 g/cm$^3$ and a specific surface area of 0.48 m$^2$/g C-3: Spherical silver powder having an average particle size of 1.0 μm, a thermal conductivity of 420 W/m° C., a tap density of 5.4 g/cm$^3$ and a specific surface area of 0.87 m$^2$/g C-4: Aluminum powder having an average particle size of 20 μm, a thermal conductivity of 230 W/m° C., a tap density of 1.5 g/cm$^3$ and a specific surface area of 0.3 m$^2$/g C-5 (Comparative example): Aluminum powder having an average particle size of 110 μm, a thermal conductivity of 230 W/m° C., a tap density of 2.0 g/cm$^3$ and a specific surface area of 0.12 m$^2$/g Component (D)

D-1 (Platinum catalyst): A-1 solution of platinum-divinyltetramethyldisiloxane complex, containing 1 wt % of platinum atoms D-2 (Organic peroxide): Peroxide, PERHEXA C by NOF CORPORATION D-3 (Catalyst for condensation reaction): Tetramethylguanidylpropyltrimethoxysilane Component (G)

G-1: Organosilane represented by the following formula

[Chemical formula]

(OMe)$_3$Si~~~~~~~~~O—C(=CH$_2$)—C(=O)

Component (H) Curing Reaction Inhibitor

H-1: 1-ethynyl-1-cyclohexanol

Component (I) Curing Agent 1-1: Vinyltri(isopropenoxy)silane

Working Examples 1 to 15; and Comparative Examples 1 to 7

Compositions in working examples 1 to 15; and comparative examples 1 to 7 were obtained by mixing the given amounts of the components shown in Tables 1 to 3 as follows. Specifically, the components (A) and (G) were kneaded together in a 5 L planetary mixer (by INOUE MFG., INC.), followed by further adding thereto the components (B) and (C) so as to mix them at 25° C. for 1.5 hours. Next, the component (D), (H) or (I) was added thereto so as to mix them until the components had been homogenously mixed.

TABLE 1

Unit: part by mass

| | Working example | | | | | | | |
|---|---|---|---|---|---|---|---|---|
| | 1 | 2 | 3 | 4 | 5 | 6 | 7 | 8 |
| A-1 | 95 | 95 | 95 | 95 | 95 | 95 | 95 | 95 |
| A-2 | 5 | 5 | 5 | 5 | 5 | 5 | 5 | 5 |
| A-3 | | | | | | | | |
| B-1 | 400 | 800 | 800 | 500 | 500 | 500 | 500 | 500 |
| B-2 | | | | | | | | |
| B-3 | | | | | | | | |
| B-4 | | | | | | | | |
| B-5 | | | | | | | | |
| C-1 | 200 | 200 | 1200 | 500 | | | | 500 |
| C-2 | | | | | 500 | | | |
| C-3 | | | | | | 500 | | |
| C-4 | | | | | | | 500 | |
| C-5 | | | | | | | | |
| D-1 | 6.73 | 6.73 | 6.73 | 6.73 | 6.73 | 6.73 | 6.73 | 6.73 |
| D-2 | | | | | | | | |
| D-3 | | | | | | | | |
| G-1 | | | | | | | | 10 |
| H-1 | 0.17 | 0.17 | 0.17 | 0.17 | 0.17 | 0.17 | 0.17 | 0.17 |
| I-1 | | | | | | | | |
| Mass ratio of mass α of component B to mass β of component C (α/β) | 2.00 | 4.00 | 0.67 | 1.00 | 1.00 | 1.00 | 1.00 | 1.00 |
| Viscosity (Pa · s) | 123 | 355 | 399 | 193 | 174 | 200 | 280 | 153 |
| BLT before heating (μm) | 44 | 67 | 72 | 42 | 83 | 40 | 45 | 42 |
| BLT after heating (μm) | 20 | 48 | 53 | 27 | 44 | 24 | 40 | 27 |
| Thermal resistance before heating ($mm^2$ · K/W) | 17.7 | 18.8 | 15.6 | 13.2 | 8.0 | 16.3 | 11.2 | 18.2 |
| Thermal resistance after heating ($mm^2$ · K/W) | 2.7 | 1.8 | 1.6 | 1.5 | 1.4 | 1.7 | 3.2 | 2.8 |
| Thermal resistance after heating/ Thermal resistance before heating | 0.15 | 0.10 | 0.10 | 0.11 | 0.18 | 0.10 | 0.29 | 0.15 |
| Adhesion strength when cured at 60° C. (kgf/$cm^2$) | 1.8 | 4.2 | 4.8 | 4.5 | 2.1 | 3.7 | 2.3 | 2.5 |
| Adhesion strength when cured at 150° C. (kgf/$cm^2$) | 10.5 | 12.4 | 22.8 | 16.8 | 15.2 | 21.6 | 16.5 | 12.8 |
| Adhesion strength when cured at 150° C./ Adhesion strength when cured at 60° C. | 5.83 | 2.95 | 4.75 | 3.73 | 7.24 | 5.84 | 7.17 | 5.12 |

TABLE 2

Unit: part by mass

| | Working example | | | | | | |
|---|---|---|---|---|---|---|---|
| | 9 | 10 | 11 | 12 | 13 | 14 | 15 |
| A-1 | 95 | 95 | 95 | 95 | 95 | 95 | |
| A-2 | 5 | 5 | 5 | 5 | 5 | 5 | |
| A-3 | | | | | | | 100 |
| B-1 | 500 | | | 50 | 1700 | 1700 | 500 |
| B-2 | | 500 | | | | | |
| B-3 | | | 500 | | | | |
| B-4 | | | | | | | |
| B-5 | | | | | | | |
| C-1 | 500 | 500 | 500 | 1700 | 3000 | 100 | 500 |
| C-2 | | | | | | | |
| C-3 | | | | | | | |
| C-4 | | | | | | | |
| C-5 | | | | | | | |
| D-1 | | | | | | | |
| D-2 | 6.00 | 6.00 | 6.00 | 6.00 | 6.00 | 6.00 | |
| D-3 | | | | | | | 7.00 |
| G-1 | | | | | | | |
| H-1 | | | | | | | |
| I-1 | | | | | | | 1 |
| Mass ratio of mass α of component B to mass β of component C (α/β) | 1.00 | 1.00 | 1.00 | 0.03 | 0.57 | 17.00 | 1.00 |
| Viscosity (Pa · s) | 197 | 389 | 168 | 300 | 458 | 400 | 190 |
| BLT before heating (μm) | 40 | 44 | 53 | 40 | 80 | 60 | 45 |

TABLE 2-continued

Unit: part by mass

| | Working example | | | | | | |
|---|---|---|---|---|---|---|---|
| | 9 | 10 | 11 | 12 | 13 | 14 | 15 |
| BLT after heating (μm) | 25 | 22 | 32 | 20 | 58 | 25 | 28 |
| Thermal resistance before heating (mm$^2$ · K/W) | 13.8 | 11.7 | 16.8 | 9.8 | 19.6 | 16.7 | 13.0 |
| Thermal resistance after heating (mm$^2$ · K/W) | 1.5 | 2.8 | 1.9 | 3.5 | 1.6 | 1.5 | 1.7 |
| Thermal resistance after heating/ Thermal resistance before heating | 0.11 | 0.24 | 0.11 | 0.36 | 0.08 | 0.09 | 0.13 |
| Adhesion strength when cured at 60° C. (kgf/cm$^2$) | 4.2 | 2.2 | 3.3 | 1.9 | 5.0 | 3.0 | 4.0 |
| Adhesion strength when cured at 150° C. (kgf/cm$^2$) | 17.0 | 12.3 | 18.9 | 10.0 | 24.8 | 20.8 | 14.8 |
| Adhesion strength when cured at 150° C./ Adhesion strength when cured at 60° C. | 4.05 | 5.59 | 5.73 | 5.26 | 4.96 | 6.93 | 3.70 |

TABLE 3

Unit: part by mass

| | Comparative example | | | | | | |
|---|---|---|---|---|---|---|---|
| | 1 | 2 | 3 | 4 | 5 | 6 | 7 |
| A-1 | 95 | 95 | 95 | 95 | 95 | 95 | 95 |
| A-2 | 5 | 5 | 5 | 5 | 5 | 5 | 5 |
| A-3 | | | | | | | |
| B-1 | 40 | 1800 | 500 | 500 | 500 | | |
| B-2 | | | | | | | |
| B-3 | | | | | | | |
| B-4 | | | | | | 500 | |
| B-5 | | | | | | | 500 |
| C-1 | 500 | 200 | | 40 | | 500 | 500 |
| C-2 | | | | | 3100 | | |
| C-3 | | | | | | | |
| C-4 | | | | | | | |
| C-5 | | | 500 | | | | |
| D-1 | 6.73 | 6.73 | 6.73 | 6.73 | 6.73 | 6.73 | 6.73 |
| D-2 | | | | | | | |
| D-3 | | | | | | | |
| G-1 | | | | | | | |
| H-1 | 0.17 | 0.17 | 0.17 | 0.17 | 0.17 | 0.17 | 0.17 |
| I-1 | | | | | | | |
| Mass ratio of mass α of component B to mass β of component C (α/β) | 0.08 | 9.00 | 1.00 | 12.50 | 0.16 | 1.00 | 1.00 |
| Viscosity (Pa · s) | 100 | Failed to form grease-like matter | 189 | 111 | Failed to form grease-like matter | Failed to form grease-like matter | 223 |
| BLT before heating (μm) | 22 | | 150 | 44 | | | 55 |
| BLT after heating (μm) | 20 | | 140 | 20 | | | 33 |
| Thermal resistance before heating (mm$^2$ · K/W) | 15.8 | | 33.0 | 30.2 | | | 18.7 |
| Thermal resistance after heating (mm$^2$ · K/W) | 12.2 | | 14.0 | 15.7 | | | 18.0 |
| Thermal resistance after heating/ Thermal resistance before heating | 0.77 | | 0.42 | 0.52 | | | 0.96 |
| Adhesion strength when cured at 60° C. (kgf/cm$^2$) | 1.8 | | 4.8 | 3.9 | | | 4.2 |
| Adhesion strength when cured at 150° C. (kgf/cm$^2$) | 3.2 | | 12.8 | 7.5 | | | 8.0 |
| Adhesion strength when cured at 150° C./ Adhesion strength when cured at 60° C. | 1.78 | | 2.67 | 1.92 | | | 1.90 |

INDUSTRIAL APPLICABILITY

The present invention is useful as an adhesive agent used between a heat-generating electronic part and a heat dissipator in a semiconductor device.

DESCRIPTION OF THE SYMBOLS

1. Substrate
2. Heat-generating electronic part (CPU)
3. Thermal conductive silicone composition layer
4. Heat dissipator (Lid)

The invention claimed is:

1. A thermal conductive silicone composition comprising:
   (A) an organopolysiloxane having a kinetic viscosity of 10 to 100,000 mm²/s at 25° C., and represented by the following average composition formula (1)

$$R^1_a SiO_{(4-a)/2} \qquad (1)$$

wherein $R^1$ represents a hydrogen atom, a hydroxy group or a saturated or unsaturated monovalent hydrocarbon group having 1 to 18 carbon atoms, and a represents a number satisfying $1.8 \leq a \leq 2.2$;
   (B) silver nanoparticles having an average particle size of 3 to 600 nm, the silver nanoparticles being in an amount of 50 to 1,700 parts by mass per 100 parts by mass of the component (A);
   (C) a thermal conductive filler other than the component (B), having an average particle size of 0.7 to 100 μm and a thermal conductivity of 10 W/m° C. or higher, the thermal conductive filler being in an amount of 50 to 3,000 parts by mass per 100 parts by mass of the component (A); and
   (D) a catalyst selected from the group consisting of a platinum based catalyst, an organic peroxide and a catalyst for condensation reaction, the catalyst (D) being in a catalytic amount,
   wherein the thermal conductive filler as the component (C) has a tap density of 3.0 to 7.0 g/cm³ and a specific surface area of 0.08 to 2.0 m²/g.

2. The thermal conductive silicone composition according to claim 1, wherein a ratio of a thermal resistance of the composition after heating at 150° C. for 90 min with respect to a thermal resistance of the composition before the heating (thermal resistance after the heating/thermal resistance before the heating) is not higher than 0.5; and a value of (adhesion strength after the heating at 150° C. for 90 min)/(adhesion strength after heating at 60° C. for 90 min) is not smaller than 2.0.

3. The thermal conductive silicone composition according to claim 2, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

4. The thermal conductive silicone composition according to claim 2, further comprising:
   (G) an organosilane being in an amount of 0.1 to 20 parts by mass per 100 parts by mass of the component (A), and represented by the following average composition formula (2)

$$R^2_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

5. The thermal conductive silicone composition according to claim 1, wherein the thermal conductive filler as the component (C) is a silver powder having an average particle size of 0.7 to 20 μm.

6. The thermal conductive silicone composition according to claim 5, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

7. The thermal conductive silicone composition according to claim 5, further comprising:
   (G) an organosilane being in an amount of 0.1 to 20 parts by mass per 100 parts by mass of the component (A), and represented by the following average composition formula (2)

$$R^2_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

8. The thermal conductive silicone composition according to claim 1, wherein a mass ratio α/β which is a ratio of a mass α of the silver nanoparticles as the component (B) to a mass β of the thermal conductive filler as the component (C) is 0.03 to 40.

9. The thermal conductive silicone composition according to claim 8, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

10. The thermal conductive silicone composition according to claim 8, further comprising:
    (G) an organosilane being in an amount of 0.1 to 20 parts by mass per 100 parts by mass of the component (A), and represented by the following average composition formula (2)

$$R^2_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

11. The thermal conductive silicone composition according to claim 1, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

12. The thermal conductive silicone composition according to claim 11, further comprising:

(G) an organosilane being in an amount of 0.1 to 20 parts by mass per 100 parts by mass of the component (A), and represented by the following average composition formula (2)

$$R^2{}_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

13. The thermal conductive silicone composition according to claim 1, further comprising:
(G) an organosilane being in an amount of 0.1 to 20 parts by mass per 100 parts by mass of the component (A), and represented by the following average composition formula (2)

$$R^2{}_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

14. A semiconductor device comprising a heat-generating electronic part and a heat dissipator wherein the thermal conductive silicone composition as set forth in claim 1 is interposed between the heat-generating electronic part and the heat dissipator.

15. A method for manufacturing a semiconductor device, comprising a step of heating the thermal conductive silicone composition as set forth in claim 1 to 80° C. or higher with the thermal conductive silicone composition being sandwiched between a heat-generating electronic part and a heat dissipator, and with a pressure of 0.01 MPa or higher being applied thereto.

16. A thermal conductive silicone composition comprising:
(A) an organopolysiloxane having a kinetic viscosity of 10 to 100,000 mm$^2$/s at 25° C., and represented by the following average composition formula (1)

$$R^1{}_a SiO_{(4-a)/2} \qquad (1)$$

wherein $R^1$ represents a hydrogen atom, a hydroxy group or a saturated or unsaturated monovalent hydrocarbon group having 1 to 18 carbon atoms, and a represents a number satisfying $1.8 \leq a \leq 2.2$;
(B) silver nanoparticles having an average particle size of 3 to 600 nm, the silver nanoparticles being in an amount of 50 to 1,700 parts by mass per 100 parts by mass of the component (A);
(C) a thermal conductive filler other than the component (B), having an average particle size of 0.7 to 100 μm and a thermal conductivity of 10 W/m° C. or higher, the thermal conductive filler being in an amount of 50 to 3,000 parts by mass per 100 parts by mass of the component (A);
(D) a catalyst selected from the group consisting of a platinum based catalyst, an organic peroxide and a catalyst for condensation reaction, the catalyst (D) being in a catalytic amount; and (G) an organosilane being in an amount of 0.1 to 20 parts by mass per 100 parts by mass of the component (A), and represented by the following average composition formula (2)

$$R^2{}_b Si(OR^3)_{4-b} \qquad (2)$$

wherein $R^2$ represents at least one group selected from: a saturated or unsaturated monovalent hydrocarbon group that may have a substituent group(s) and has 1 to 18 carbon atoms; an epoxy group; an acryl group; and a methacryl group, $R^3$ represents a monovalent hydrocarbon group having 1 to 18 carbon atoms, and b represents a number satisfying $1 \leq b \leq 3$.

17. The thermal conductive silicone composition according to claim 16, wherein a ratio of a thermal resistance of the composition after heating at 150° C. for 90 min with respect to a thermal resistance of the composition before the heating (thermal resistance after the heating/thermal resistance before the heating) is not higher than 0.5; and a value of (adhesion strength after the heating at 150° C. for 90 min)/(adhesion strength after heating at 60° C. for 90 min) is not smaller than 2.0.

18. The thermal conductive silicone composition according to claim 17, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

19. The thermal conductive silicone composition according to claim 16, wherein the thermal conductive filler as the component (C) is a silver powder having an average particle size of 0.7 to 20 μm.

20. The thermal conductive silicone composition according to claim 19, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

21. The thermal conductive silicone composition according to claim 16, wherein a mass ratio α/β which is a ratio of a mass α of the silver nanoparticles as the component (B) to a mass β of the thermal conductive filler as the component (C) is 0.03 to 40.

22. The thermal conductive silicone composition according to claim 21, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

23. The thermal conductive silicone composition according to claim 16, wherein a part of or the whole component (A) is a component (E) which is an organopolysiloxane containing in one molecule at least two silicon atom-bonded alkenyl groups; and/or a component (F) which is an organohydrogenpolysiloxane containing in one molecule at least two silicon atom-bonded hydrogen atoms.

24. A semiconductor device comprising a heat-generating electronic part and a heat dissipator wherein the thermal conductive silicone composition as set forth in claim 16 is interposed between the heat-generating electronic part and the heat dissipator.

25. A method for manufacturing a semiconductor device, comprising a step of heating the thermal conductive silicone composition as set forth in claim 16 to 80° C. or higher with the thermal conductive silicone composition being sandwiched between a heat-generating electronic part and a heat dissipator, and with a pressure of 0.01 MPa or higher being applied thereto.

* * * * *